(12) United States Patent
Li et al.

(10) Patent No.: US 6,197,117 B1
(45) Date of Patent: Mar. 6, 2001

(54) WAFER OUT-OF-POCKET DETECTOR AND SUSCEPTOR LEVELING TOOL

(75) Inventors: Shih-Hung Li, Sunnyvale; Curtis Vass, Pleasanton, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 08/899,448

(22) Filed: Jul. 23, 1997

(51) Int. Cl.$^7$ .................................................. C23C 16/00
(52) U.S. Cl. ..................... 118/715; 118/728; 414/222; 414/936
(58) Field of Search .............................. 356/152.2, 139.1; 414/222, 936; 118/715, 728

(56) References Cited

U.S. PATENT DOCUMENTS

| | | | |
|---|---|---|---|
| 3,740,563 | 6/1973 | Reichard | 250/222 |
| 4,282,184 | 8/1981 | Fiegl et al. | 422/106 |
| 4,697,089 | 9/1987 | Drage | 250/561 |
| 4,724,322 | 2/1988 | Knowles et al. | 250/341 |
| 4,744,713 | 5/1988 | Hrovath . | |
| 4,911,597 | 3/1990 | Maydan et al. | 414/217 |
| 4,978,841 | 12/1990 | Barrett et al. . | |
| 5,191,200 | * 3/1993 | Van Der Werf et al. | 250/201.4 |
| 5,194,743 | 3/1993 | Aoyama et al. | 250/548 |
| 5,194,744 | * 3/1993 | Aoki et al. | 250/548 |
| 5,227,862 | 7/1993 | Oshida et al. | 356/363 |
| 5,333,413 | * 8/1994 | Hashimoto | 51/165.75 |
| 5,461,237 | * 10/1995 | Wakamoto et al. | 250/548 |
| 5,497,419 | * 3/1996 | Hill | 380/9 |
| 5,561,416 | * 10/1996 | Marshall et al. | 340/456 |
| 5,563,798 | 10/1996 | Berken et al. | 364/478 |
| 5,700,127 | 12/1997 | Harada et al. | 414/416 |
| 5,729,337 | * 3/1998 | Tanaka | 356/139.1 |
| 5,803,972 | * 9/1998 | Sato et al. | 118/712 |

FOREIGN PATENT DOCUMENTS 0 312 046 A2 10/1988 (EP) .
0 718 595 A2 12/1995 (EP) .

OTHER PUBLICATIONS

PCT International Search Report, International Application No. PCT/US98/15519, filed Dec. 1, 1998, mailed Aug. 12, 1998.
PCT International Search Report, International Application No. PCT/US98/15519, filed Jul. 22, 1998, mailed Nov. 24, 1998 (4 pages).

(List continued on next page.)

Primary Examiner—Shrive Beck
Assistant Examiner—Norca L. Torres-Velázquez
(74) Attorney, Agent, or Firm—Blakely Sokoloff Taylor & Zafman

(57) ABSTRACT

An apparatus and method for monitoring the level of a semiconductor processing chamber susceptor and the inclination of a wafer residing within a pocket of the susceptor. In one embodiment, a light beam transmitter is positioned to direct a light beam, such as a laser beam, onto the top surface of a wafer that has been positioned within a susceptor pocket. The light beam forms a target spot of a particular size and shape on the surface of the wafer. A camera is positioned to observe the target spot. A change in the angular orientation of the wafer or susceptor will result in a change in the size and shape of the target spot. The camera is configured to detect changes in the target spot size and shape. A logic circuit is provided at the output of the camera to correlate the observed shape and size of the target spot to a value indicative of the levelness of the susceptor and/or the inclination of a wafer located within the pocket of the susceptor. In another embodiment, the light beam is focused directly onto a surface of the susceptor. In this manner, the levelness and movement of the susceptor itself may be monitored.

93 Claims, 12 Drawing Sheets

OTHER PUBLICATIONS

Patent Abstracts of Japan, vol. 015, No. 046 (E–1029), Feb. 4, 1991 & JP 02 280313 A (Hitachi Ltd.), Nov. 16, 1990, see English language abstract.

Database WPI, Section EI, Week 9535, Derwent Publications Ltd., London, GB; Class S02, AN 95–267298, XP002084089, & JP 07 169823 A (Kokusai Denki KK), Jul. 4, 1995, see English language abstract.

* cited by examiner

WAFER OUT-OF-POCKET DETECTOR AND SUSCEPTOR LEVELING TOOL

FIELD OF THE INVENTION

The present invention relates generally to semiconductor processing and particularly to a tool for monitoring the level of a processing chamber susceptor and for detecting the position of a wafer located within a pocket of the susceptor.

BACKGROUND OF THE INVENTION

Deposition of a film on the surface of a semiconductor wafer is a common step in semiconductor processing. The process of depositing layers on a semiconductor wafer (or substrate) usually involves placing the substrate within a processing chamber and holding the wafer within a stream of a reactant gas flowing across the surface of a wafer. Usually, heat is applied to drive the chemical reaction of the gases in the chamber and to heat the surface of the wafer on which the film is deposited. The processing chamber is typically heated by external lamps which pass infra-red radiation into the processing chamber through a quartz window that is transparent to the infra-red radiation.

Referring now to FIG. 1, there is shown a multiple-chamber integrated process system 100 including an enclosed main frame or housing 102 having sidewalls that define an enclosed vacuum transfer chamber 104.

A number of individual processing chambers 106a–f are mounted one each on an associated sidewall of the transfer chamber 104. Two load lock cassette elevators 108a and 108b are adapted for vertically stacking a multiplicity of cassettes which in turn hold wafers 110 horizontally. The load lock cassette elevator assemblies 108a and 108b selectively position each cassette directly opposite and aligned with a transfer chamber entrance slit or opening 112a and 112b, respectively. Each cassette holds multiple wafers. Wafers 110 are held within the cassette by a set of support structures 111 having a diameter that is slightly larger than the diameter of the wafers being housed.

Processing chambers 106a–f and the associated main frame side walls also have communicating slits 114a–f, respectively, which are similar to the load lock entrance slits 112a and 112b. Doors or slit valves (not shown) are provided for sealing the access slits.

A robotic wafer transfer system 120 is mounted within transfer chamber 104 for transferring wafers 110 between load locks 108a and 108b and the individual processing chambers 106a–f. Robot assembly 120 includes a blade 122 and a driver (not shown) that imparts both rotational and reciprocating movement to blade 122 for affecting the desired cassette-to-chamber, chamber-to-chamber and chamber-to-cassette wafer transfer. The reciprocating movement (straight line extension and retraction) is indicated by arrow 130, while the pivotal or rotational movement is indicated by arrow 140.

FIG. 2 illustrates a cross-sectional view of an exemplary semiconductor processing chamber, such as processing chamber 106a depicted in FIG. 1. Processing chamber 106a includes an inner chamber 202 for facilitating the flow of a process gas over the surface of a wafer. The housing includes a baseplate 204 having a gas inlet port 206 and a gas exhaust port 208. An upper clamp ring 210 and a lower clamp ring 212 act to hold a quartz cover member 214 and a quartz lower member 216 in place, respectively. Process gas is injected into chamber 202 through gas inlet port 206 which is connected to a gas source. Residual process gas and various waste products are continuously removed from the interior of chamber 202 through exhaust port 208. Arrows F indicate the typical flow path of a reactant gas passing through the chamber.

Wafers are placed into and removed from chamber 202 by the robotic wafer handling system 120 through an opening 203 formed in the side wall of the chamber.

A susceptor 224 holds the wafer in position during the semiconductor layer deposition process. As shown in FIG. 2, susceptor 224 includes a pocket 225 that is defined by at least one annular or planar bottom surface 226 and a cylindrical side wall 227. The depth of pocket 225 is generally chosen so that the top surface of the wafer being processed is approximately level with the top surface of the susceptor. Susceptor support 229 is coupled to susceptor 224 for rotating the wafer during the semiconductor fabrication process. Susceptor 224 also includes a plurality of through holes 240 for receiving at least three pins 242. Loading position pins 242 are attached to a support shaft 244 that provides vertical movement to raise and lower pins 242. Pins 242 are used to raise a wafer above susceptor surface 226 while the wafer is being loaded or unloaded into the chamber. Raising of the wafer permits the robot blade from scraping or otherwise damaging the susceptor surface during the wafer loading or unloading procedure.

Heating lamps 228 and 230 provide infra-red radiant heat into the chamber through window portion 214 and quartz lower member 216 which are transparent to infra-red radiation.

In deposition processes, it is desirable to maximize wafer throughput while depositing film layers that have uniform thickness. With the increasing miniaturization of electronic circuits, there is a need to more accurately control the thickness of the deposition layers during semiconductor wafer processing. Among other requirements, in order to obtain uniform deposition layer thicknesses, it is important that the angular orientation of the wafer with that of the gas flow be essentially equal at all points along the wafer surface during the deposition process. The need to accurately maintain the proper angular orientation of the wafer has become even more important as the size of the wafers has increased. As such, it is important that the inclination of the susceptor be properly maintained. In order to properly maintain the inclination or level of the susceptor, it is necessary to monitor the levelness of the susceptor.

As discussed above, a robotic wafer handling system is often used to position a wafer within the pocket of a semiconductor processing chamber susceptor. As shown in FIGS. 3A and 3B, in some instances a wafer 300 is improperly placed on the susceptor 302. As a result, a portion of the wafer will reside outside of the susceptor pocket 304 causing the wafer to be out of alignment with the reactant gas flow stream. Currently, there is no method for detecting whether a wafer has been properly placed within the susceptor pocket.

The slant or tilt of the out-of-pocket wafer will result in an uneven film deposition across the surface of the wafer and an uniform resistivity. If the film deposition thickness or resistivity of a wafer is found to be non-uniform during post-process testing, that wafer and every wafer residing within the same cassette is discarded. This adversely affects throughput and results in higher processing costs.

Therefore, what is needed is a method and an apparatus for accurately monitoring the level of a semiconductor processing chamber susceptor and for determining the angular position of a wafer located within a pocket of the susceptor.

SUMMARY OF THE INVENTION

An apparatus and method for monitoring the level of a semiconductor processing chamber susceptor and the inclination of a wafer residing within a pocket of the susceptor is disclosed. The apparatus of the present invention includes a light beam transmitter that is positioned to direct a light beam, such as a laser beam, onto the top surface of a wafer that has been positioned within a susceptor pocket. The light beam forms a target spot of a particular size and shape on the surface of the wafer. A CCD (charged couple diode) camera is positioned to observe the target spot. A change in the angular orientation of the wafer or susceptor will result in a change in the size and shape of the target spot. The CCD camera is configured to detect changes in the target spot size and shape. A logic circuit is provided at the output of the CCD camera to correlate the observed shape and size of the target spot to a value indicative of the levelness of the susceptor and/or the inclination of a wafer located within the pocket of the susceptor. In lieu of focusing the light beam on a wafer residing within a pocket of a susceptor, the light beam may be focused directly onto a surface of the susceptor. In this manner the levelness and movement of the susceptor itself may be monitored.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for monitoring the level of a semiconductor processing chamber susceptor and the inclination of a wafer residing within a pocket of the susceptor is disclosed. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

As previously discussed, in order to obtain uniform deposition layer thicknesses across the surface of a wafer, it is important that the angular orientation of the wafer with that of the gas flow be essentially equal at all points along the wafer surface. The need to more accurately maintain the proper angular orientation of the wafer has become increasingly more important with the increasing miniaturization of electronic circuits and the larger sized wafers being processed. In accordance with the present invention, a susceptor level and wafer detection system wafer is provided that is capable of monitoring the levelness and movement of a susceptor and the inclination of a wafer that is being supported by a susceptor within a semiconductor processing chamber.

Figure 1:
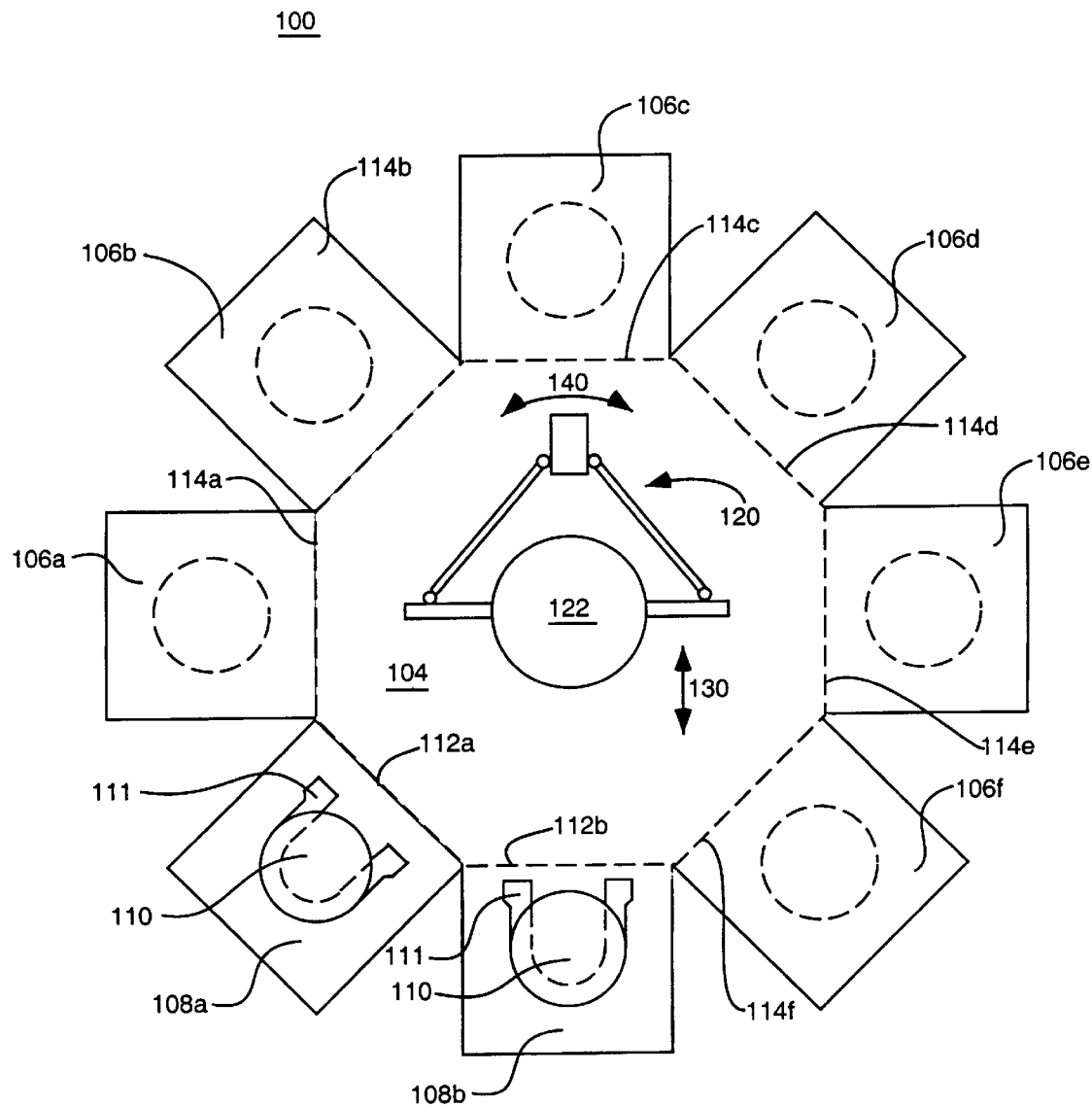
FIG. 1 illustrates a top view of a multiple chamber semiconductor processing unit.
Figure 2:
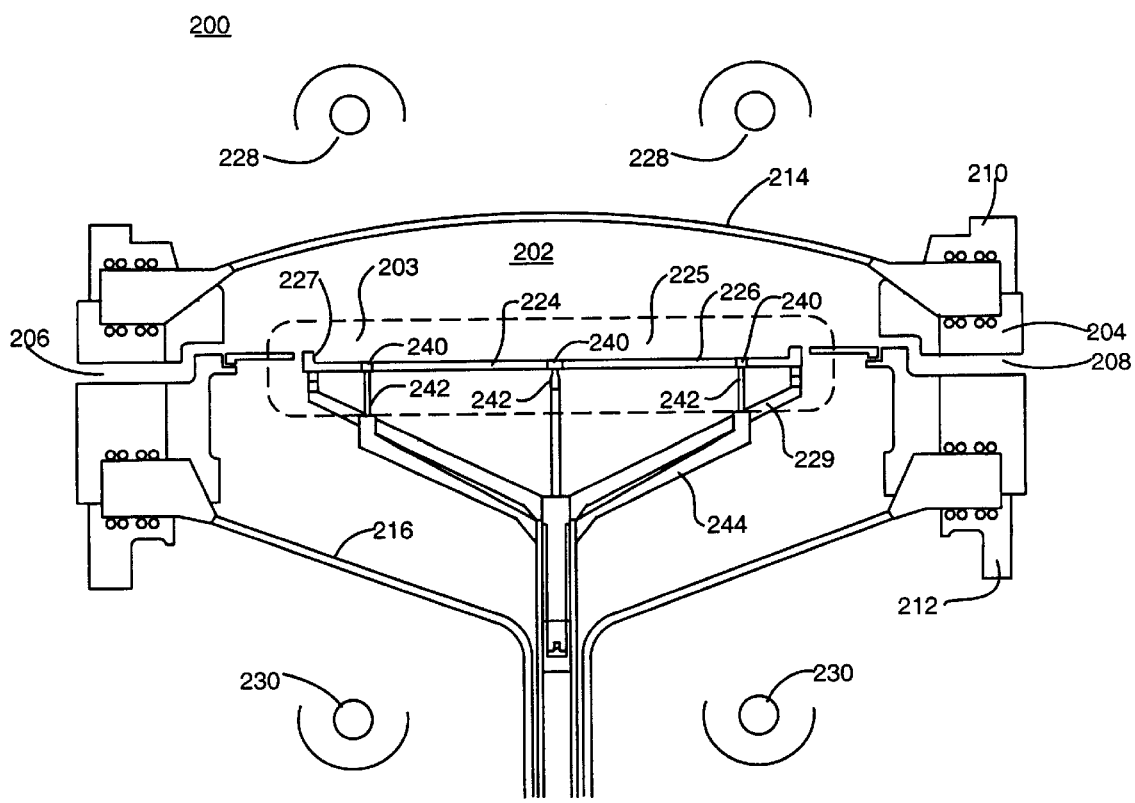
FIG. 2 illustrates a typical cross-sectional view of a semiconductor processing chamber shown in FIG. 1.
Figure 3A:
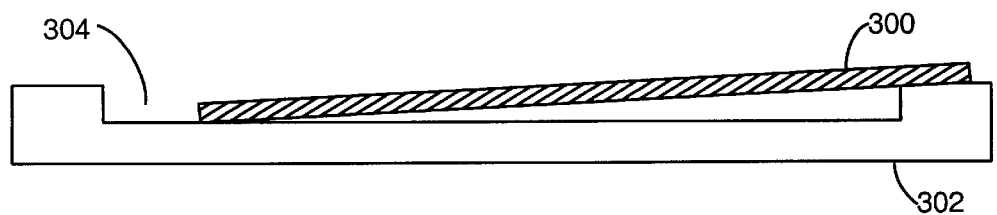
FIG. 3A illustrates a side view of a wafer that is improperly placed within a pocket of a susceptor.
Figure 3B:
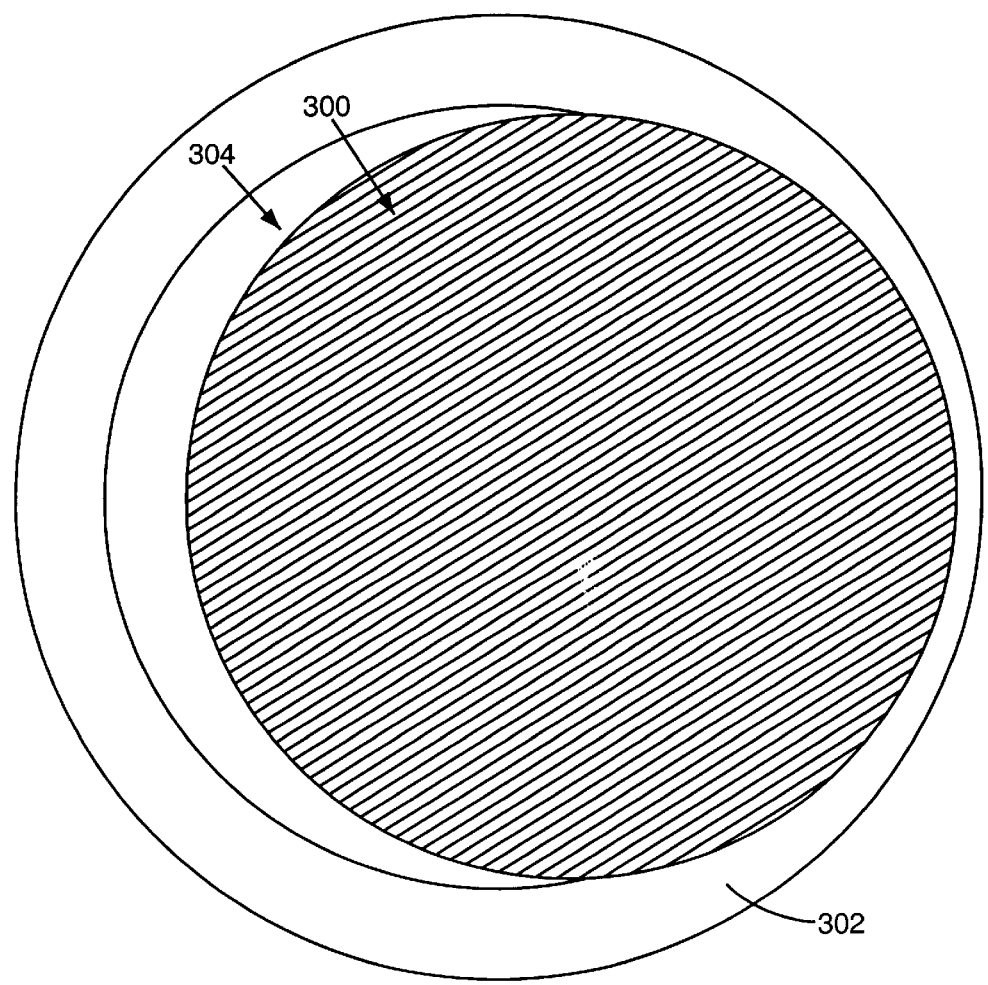
FIG. 3B illustrates a top view of the wafer and susceptor shown in FIG. 3A.
Figure 4:
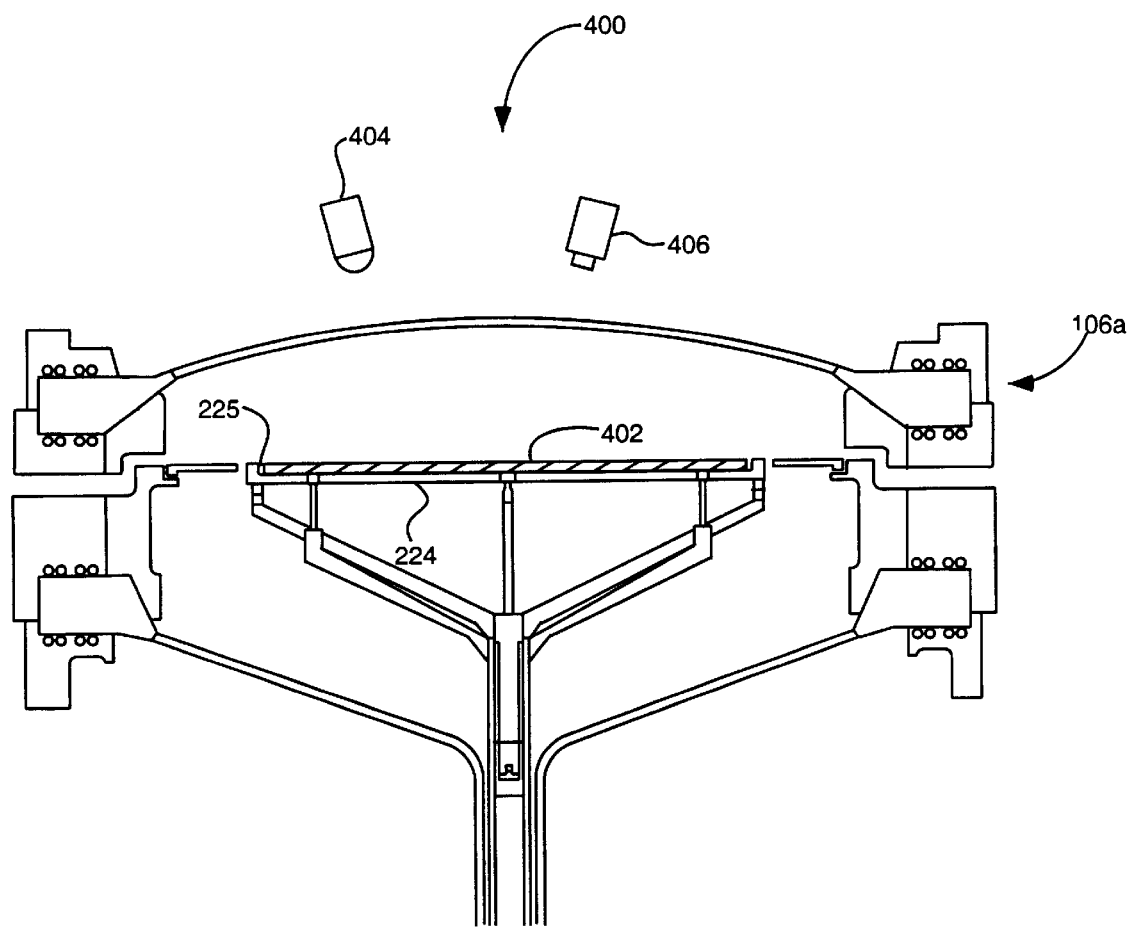
FIG. 4 illustrates the processing chamber of FIG. 2 having a wafer out-of-pocket and susceptor level detection system of the present invention.

FIG. 4 illustrates the processing chamber 106a of FIG. 2 having a susceptor level and wafer detection system 400 configured to monitor the inclination of a wafer 402 residing within the pocket 225 of susceptor 224. Detection system 400 may also be used to measure the levelness and movement of susceptor 224. Detection system 400 includes a light transmitter 404 and a camera 406. In accordance with one embodiment of the present invention, a light beam is directed onto the top surface of a wafer 402 by light transmitter 404 to produce a target. Camera 406 is positioned to observe the target along the top surface of the wafer. Transmitter 404 is positioned relative to the wafer to produce a target of a predetermined size and shape when the wafer is properly residing in a horizontal position within pocket 225 of susceptor 224. It is appreciated that the size and shape of the target changes as the angular orientation of the wafer deviates from a reference position, which is generally a horizontal wafer position. Camera 406 observes the light beam target and generates an output signal that is received by a logic circuit 408. Logic circuit 408 generally includes pattern recognition hardware and software that correlates the observations of camera 406 into a value or signal that is indicative of the inclination of wafer 402.

As mentioned above, light transmitter 404 may also be used to direct a light beam directly onto the planar bottom surface 226 of susceptor 224. In this manner, a target is produced on the planar surface of the susceptor. This permits the angular orientation or levelness of the susceptor to be monitored and measured at anytime during a processing sequence when a wafer is not residing within the pocket of the susceptor. This provides a distinct advantage over existing methods used in determining the levelness of the susceptor. Namely, the susceptor level may be monitored without requiring the processing chamber to be shut down and opened. The ability to periodically monitor the level of the susceptor during a processing sequence permits the position of the susceptor to be adjusted and/or calibrated between the processing of individual wafers. The ability to monitor and adjust the levelness of the susceptor increases wafer yield and enhances the reliability and repeatability of the process.

In some semiconductor wafer processing chambers, susceptor 224 is able to be raised and lowered to position a wafer within the chamber. The detection system of the present invention may also be used to monitor and/or measure the vertical displacement of the susceptor during a lift cycle.

Figure 5A:
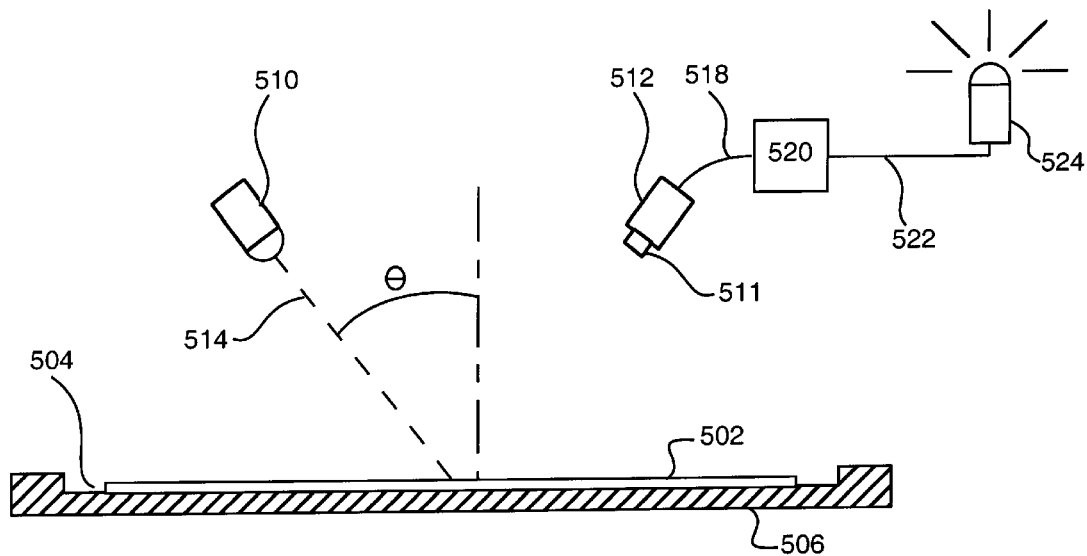
FIGS. 5A and 5B illustrate a monitoring system of the present invention being used to detect the inclination of a wafer residing within a susceptor pocket.
Figure 5B:
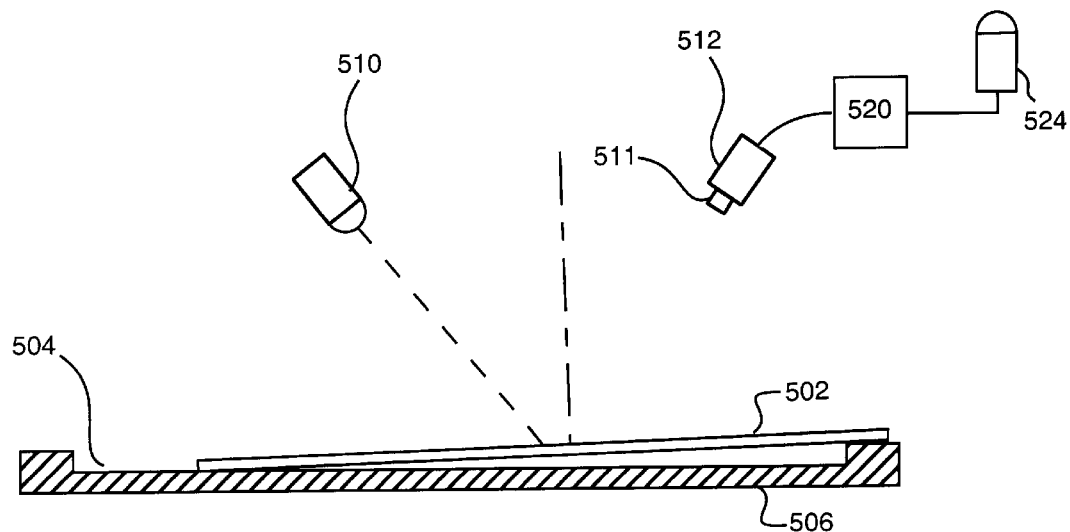
Figure 6A:
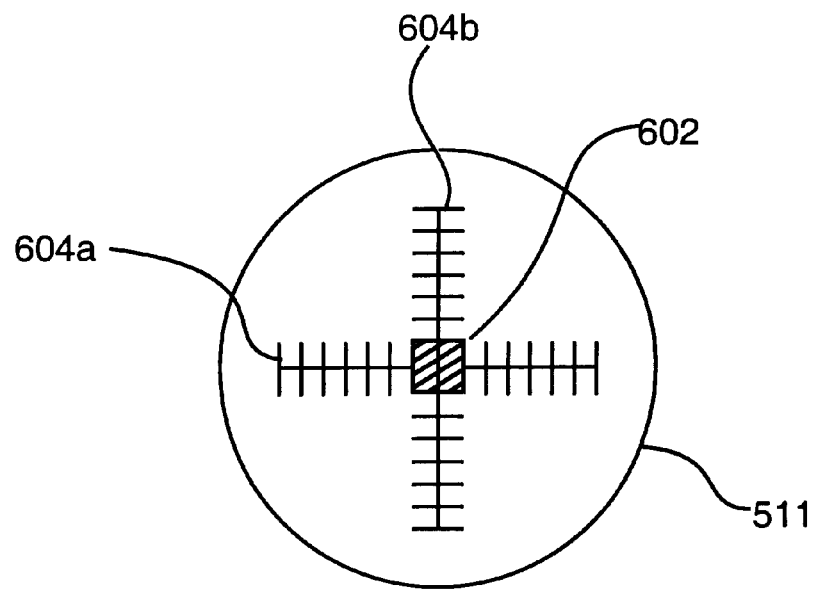
FIGS. 6A and 6B illustrate a target as observed by a camera in one embodiment of the present invention

FIGS. 5A and 5B illustrate how the detection system of the present invention may be used to detect whether a wafer has been properly positioned within a pocket of a susceptor. In FIG. 5A a wafer 502 is shown properly positioned within a pocket 504 of a susceptor 506. A light transmitter 510 is positioned to direct a light beam 514 onto the surface of wafer 502 to produce a target on the top surface of the wafer. The incident angle of light beam 514 is indicated by the angle theta. A camera 512 is positioned to observe the target produced on the top surface of the wafer. When wafer 502 is properly positioned within the pocket 504 of susceptor 506, the position of the target 602 as observed through the lens 511 of camera 512 is centered within the observation axes 604a and 604b of lens 511 as shown in FIG. 6A. Note also, that target 602 has a particular shape and size when wafer 502 is properly positioned within the pocket of the susceptor. The size and shape of target 602 varies as the inclination of wafer 502 relative to the light transmitter 510 changes. Thus, another method of determining if wafer 502 has been properly placed into the pocket 504 of susceptor 506 is to observe and measure the size and shape of target 602.

Figure 6B:
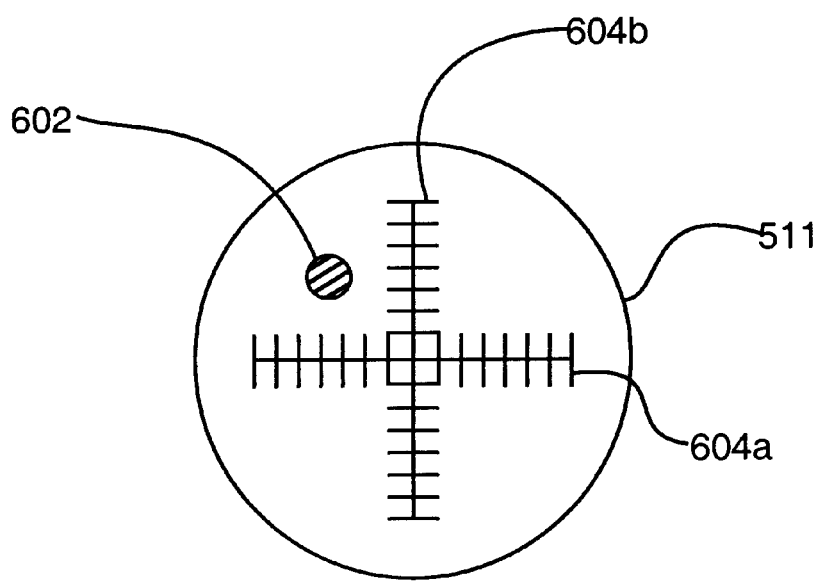

FIG. 5B shows wafer 502 improperly positioned within the pocket 504 of susceptor 506. As a result of the wafer being improperly positioned within the pocket, the surface of the wafer is slightly tilted. As shown in FIG. 6B, the tilted orientation of wafer 502 causes target 602 to move from a centered position to an off-centered position. Camera 512 is configured to observe the position and/or shape of target 602 and to generate at least one output signal 518 that is indicative of the observation. A logic circuit 520 receives signal 518 and correlates the camera signal to a value or signal that is representative of the wafer's position. The output signal 522 of circuit 520 is then used to provide a visual indication to the processing chamber operator. As shown in FIGS. 5A and 5B, the visual indication may consist of a lamp that is illuminated when the wafer is properly positioned within the pocket of the susceptor and extinguished when the wafer is improperly positioned on the susceptor. Alternatively or in combination with the use of a lamp, a value representative of the wafer's position may be provided as a digital or analog display.

Light transmitter 510 may include any type of light source that is capable of forming a target on the top surface of the wafer. Since light transmitter 510 is generally located outside the processing chamber, the energy and wavelength of the light source must be sufficient to penetrate the quartz window of the processing chamber. In one embodiment, light transmitter 510 includes a high energy laser transmitter and camera 512 includes a CCD or video camera. In one embodiment, light transmitter 510 is positioned such that the incident angle, theta, of light beam 514 is approximately 40 degrees. It is appreciated that the angular orientation of transmitter 510 and camera 512 may be increased or decreased depending upon the particular system requirements. If a more sensitive sensing device is desired, the angle between transmitter 510 and camera 512 may be widened. In lieu of using a video camera, a still camera may be utilized. In such an embodiment, camera 512 is set to capture the position and/or shape and size of the light target at predetermined time intervals.

Figure 7A:
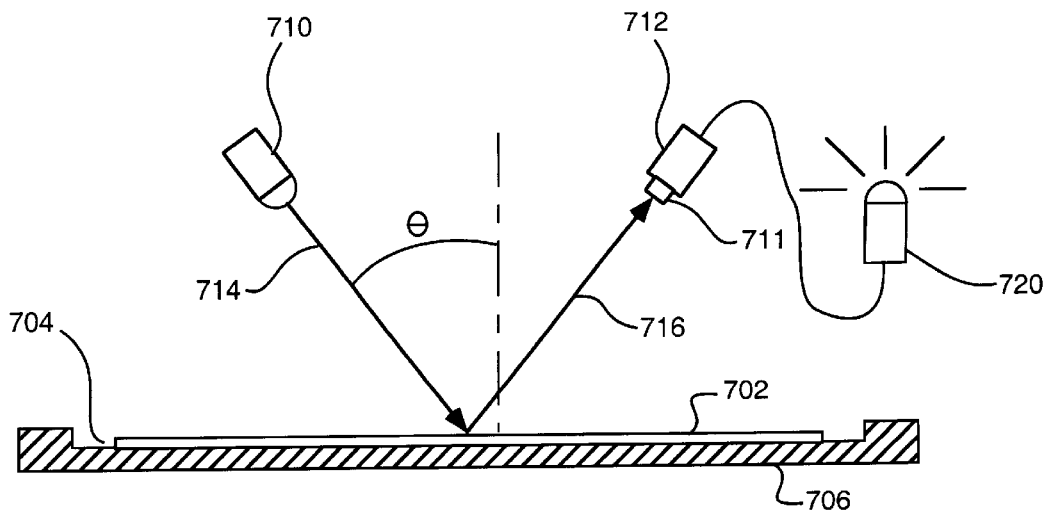
FIGS. 7A and 7B illustrate a monitoring system of another embodiment of the present invention that is used to detect the inclination of a wafer residing within a susceptor pocket.
Figure 7B:
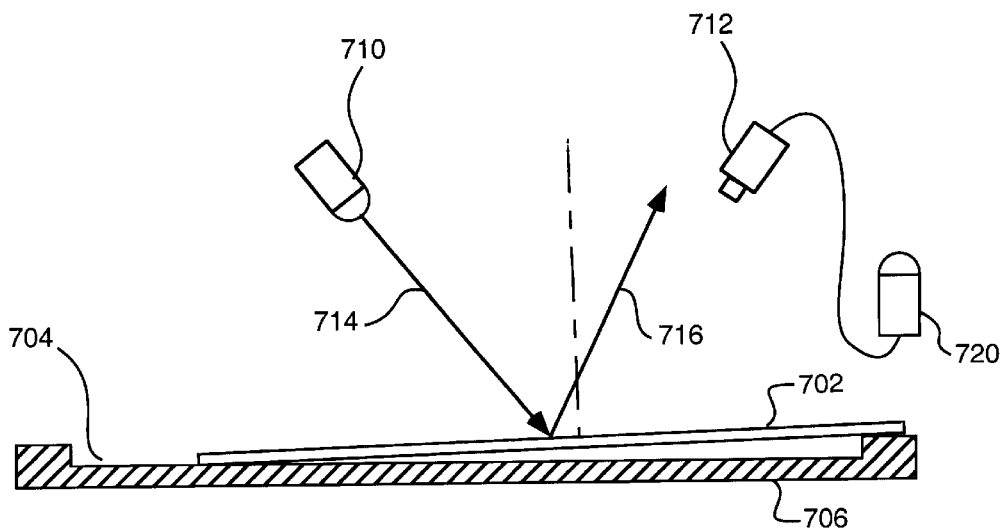

Another method of determining whether a wafer is properly positioned within the pocket of a susceptor is shown in FIGS. 7A and 7B. In FIG. 7A, a wafer 702 is shown properly positioned within a pocket 704 of a susceptor 706. A light transmitter 710 is positioned to direct a light beam 714 onto the surface of wafer 702. The incident angle of light beam 714 is indicated by the angle theta. A camera 712 is positioned to receive the reflected light beam 716 through a lens 711 when the surface of the wafer is in a horizontal position. As shown in FIG. 7A, when wafer 702 is properly positioned within the susceptor pocket, the reflected light beam 716 is received by camera 712 through lens 711. A wafer position indicator 720 is configured to receive a state signal directly or indirectly from camera 712. In the embodiment of FIG. 7A, indicator 720 comprises a lamp that is illuminated when the wafer is properly positioned within the susceptor pocket.

FIG. 7B shows wafer 702 improperly positioned within the pocket 704 of susceptor 706. As a result of the wafer being improperly positioned within the pocket, the surface of the wafer is slightly tilted. As shown, the tilted orientation of wafer 702 causes the reflected light beam 716 to be directed away from the lens 711 of camera 712. As a result, the state signal of camera 712 is off, thus indicating that a wafer out-of pocket condition exists.

In one embodiment, light transmitter 710 includes a laser transmitter and camera 712 includes a CCD or video camera. In such an embodiment, the light beam comprises a high energy laser beam. Since the lamps used to heat the processing chamber emit infra-red radiation, it is important that the light beam possess a wavelength outside the infra-red spectrum. Preferably, the wavelength of the light beam is maintained below 630 nanometers. In one embodiment, the wavelength of light beam 714 is maintained in the range of 480 to 500 nanometers.

In one embodiment, light transmitter 710 is positioned such that the incident angle, theta, of light beam 714 is approximately 40 degrees. It is appreciated the angular orientation of transmitter 710 and camera 712 may be increased or decreased depending upon the particular system requirements. If a more sensitive sensing device is desired, the angle between transmitter 710 and camera 712 may be widened.

Figure 8:
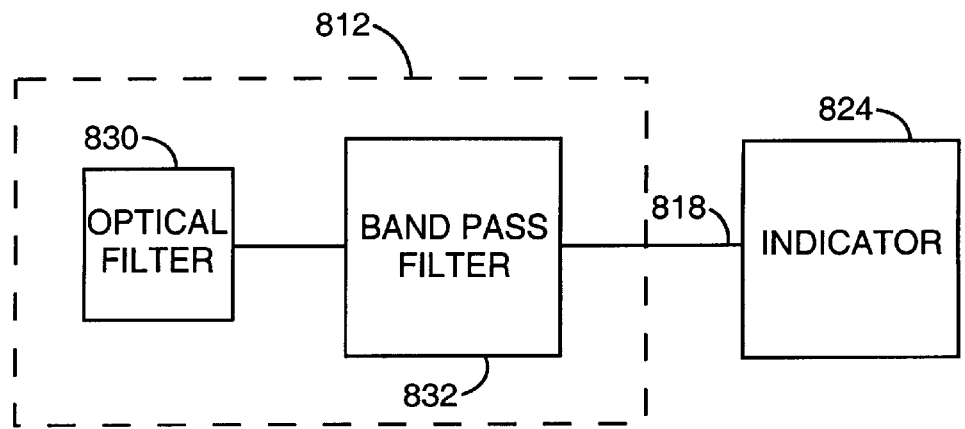
FIG. 8 illustrates a block diagram of a detection assembly in accordance with one embodiment of the present invention.

Turning now to FIG. 8, a block diagram of a camera 812 in accordance with the present invention is shown. As previously discussed, camera 812 typically includes a lens 811. Lens 811 generally includes an optical filter 830 that only permits light of a particular bandwidth to be sensed by camera 812. For example, in one embodiment optical filter 830 does not permit the transmission of infra-red light into camera 812. A bandpass filter 832 is generally provided within camera 812 to filter out noise internal to the camera, such as noise from the voltage power source. Camera 812 produces output signal 818 that is received by an indicator 824. Output signal 818 may represent the number of pixels in the image being observed. In another embodiment, camera 812 may be replaced with an analog sensor package that produces an analog signal that is representative of the shape and/or location of an image or light beam being reflected from the surface of the device being measured. In such an embodiment, an analog to digital converter may be used to convert the analog signal to a digital signal that is readable by a computer or other digital device. As previously discussed, indicator 824 may include a visual indicator, such as a lamp or a visual display. Alternatively, indicator 824 may include an audible indicator such as an alarm horn. Moreover, it is appreciated that output signal 818 may serve as an input to any of a number of intervening electronic/electrical devices that, in turn, provide a signal to indicator 824.

Figure 9:
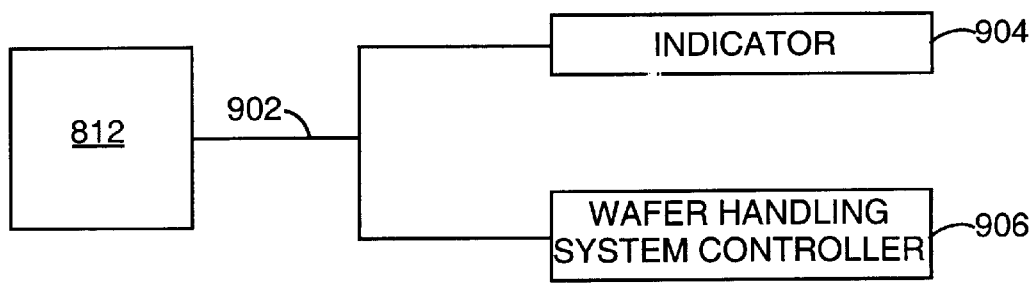
FIG. 9 illustrates a block diagram of a detection assembly in accordance with another embodiment of the present invention.

FIG. 9 illustrates another embodiment of the present invention wherein camera 812 has an output 902 that is electrically coupled to a wafer position indicator 904 and to the controller 906 of the automated wafer handling system that is used to position the wafer within the pocket of the susceptor. In this manner, when a wafer is improperly positioned on a susceptor, signal 902 may be used to initiate logic within controller 906 to cause the wafer handling system to retrieve and to attempt to reposition the wafer into the susceptor pocket.

Figure 10:
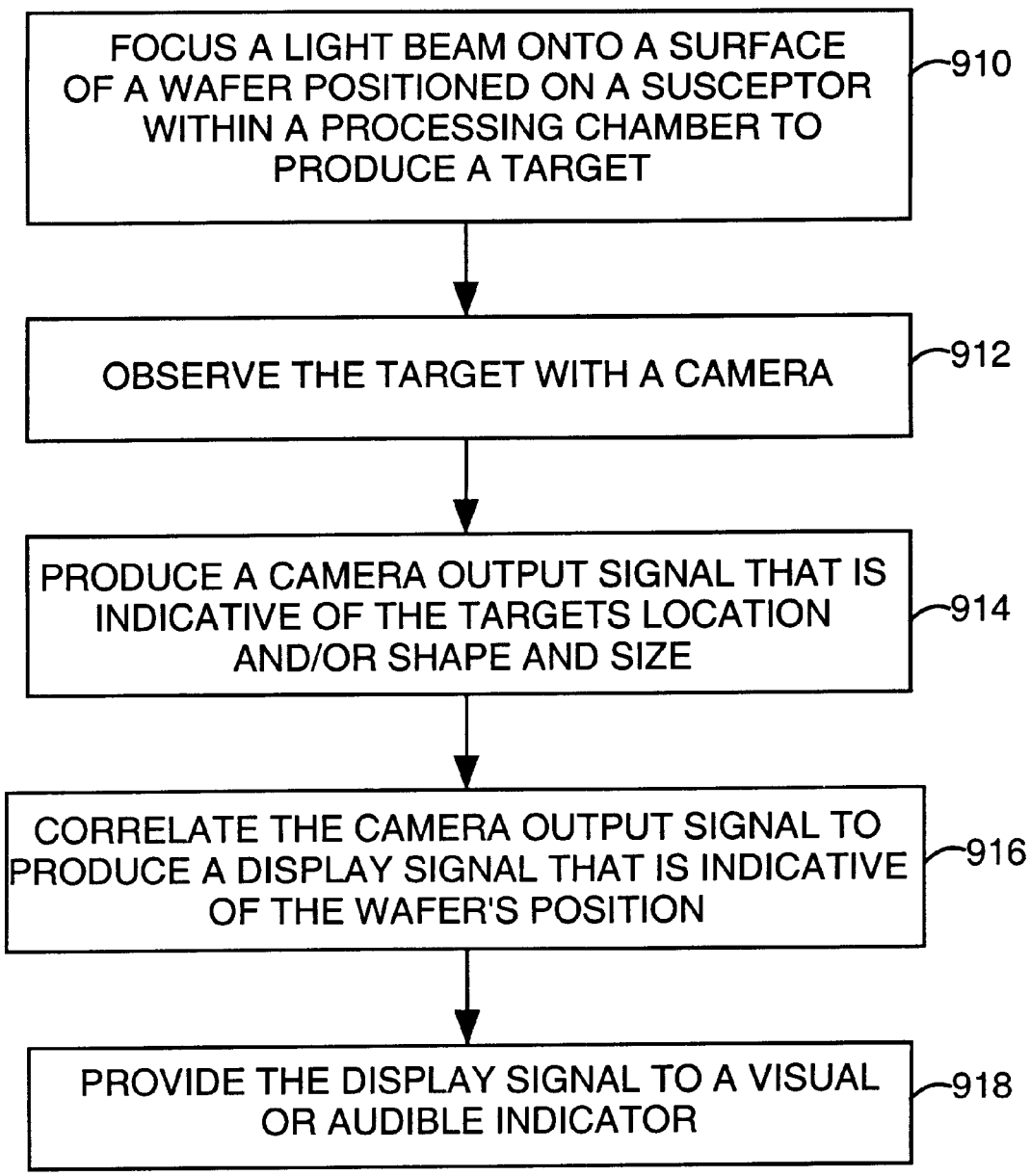
FIG. 10 is a flow chart of a method of monitoring the inclination of a wafer located within a susceptor pocket in accordance with one embodiment of the present invention.

FIG. 10 is a flow chart representing a method of detecting the inclination/position of a wafer residing within the pocket of a semiconductor processing chamber susceptor. In step 910 a light beam is focused onto the top surface of the wafer to produce a target. This step is typically accomplished by focusing the light beam through a quartz window of the processing chamber. In step 912, the target is observed by a camera that provides an output signal indicative of the target's location and/or shape and size (step 914). In step 916, the output signal of the camera is received by a logic circuit that correlates the camera signal to a value or signal indicative of the wafer's position. In step 918, the logic circuit produces an output signal to a visual or audible indicator.

Figure 11:
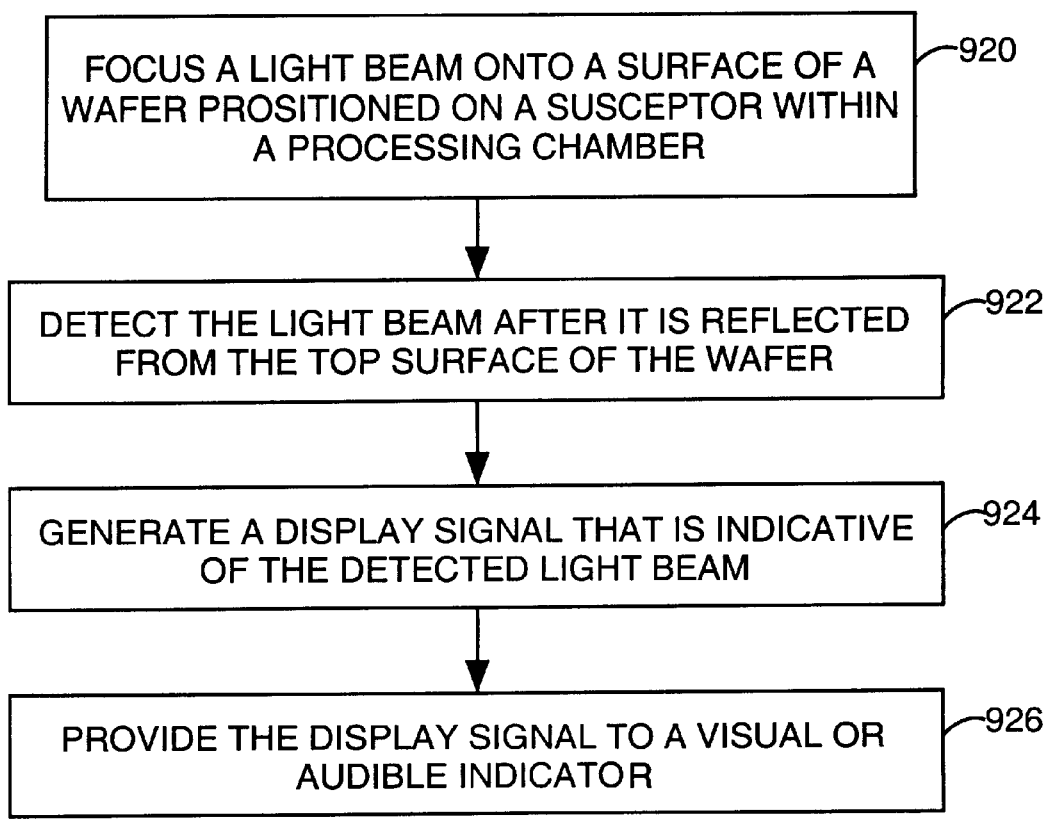
FIG. 11 is a flow chart of a method of monitoring the level of a semiconductor processing chamber susceptor in accordance with another embodiment of the present invention.

FIG. 11 is a flow chart representing another method of detecting the inclination/position of a wafer residing within the pocket of a semiconductor processing chamber susceptor. In step 920 a light beam is focused onto the top surface of the wafer. This step is typically accomplished by focusing the light beam through a quartz window of the processing chamber. In step 922, the light beam is detected after it is reflected from the surface of the wafer by a camera that provides an output signal indicative of the wafer's position to an indicator device (step 924). In step 926, the output signal is provided to a visual or audible indicator.

Figure 12:
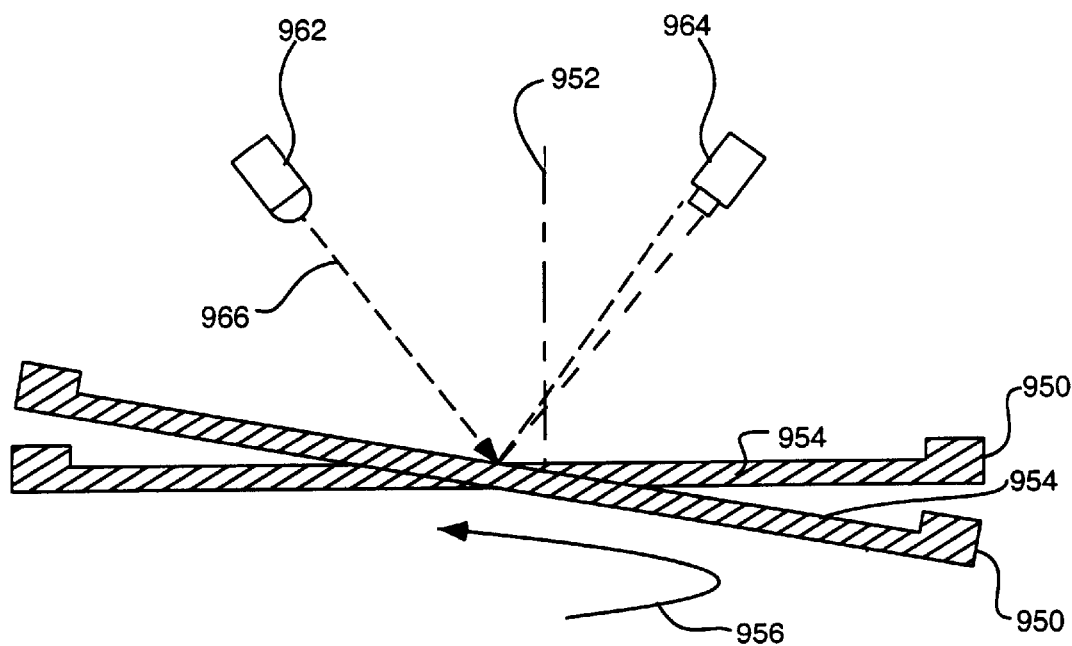
FIG. 12 illustrates a monitoring system of the present invention being used to detect the levelness of a susceptor.

As previously discussed, the detection system of the present invention may also be used to measure the levelness of a susceptor. As shown in FIG. 12, a susceptor 950 is typically rotated about an axis of rotation 952 as indicated by arrow 956. Generally, susceptor 950 includes a horizontal planar surface 954 onto which a wafer is positioned during processing. In order to achieve a uniform deposition across the surface of a wafer, it is desirable that the planar surface 954 of susceptor 950 be maintained perpendicular to the axis of rotation 952. If the planar surface 954 of susceptor 950 is not perpendicular to the axis of rotation, the susceptor will experience two types of movement: (1) an up-and-down movement, and (2) a side-to-side movement. As a result of such movement, the ability to uniformly deposit a film onto the surface of a wafer is impaired. As shown in FIG. 12, the detection system 960 of the present invention may be configured to monitor and/or measure the levelness of a susceptor. The manner in which the levelness of susceptor 950 is monitored is similar to the method used to determine the position of a wafer located on the susceptor. A light transmitter 962 is positioned to direct a light beam 966 onto the susceptor to produce a target on surface 954. A camera 964 is positioned to observe the target. As the angular position of surface 954 changes in relation to the light transmitter 962, camera 964 observes the shift in location of the target and/or a change in the size and shape of the target. The camera observation is then correlated to produce a signal that is representative of the levelness of the susceptor. It is important to note that the susceptor level measurement may also be accomplished by producing and observing a target on the top surface of a wafer positioned on surface 954 of susceptor 950.

Figure 13:
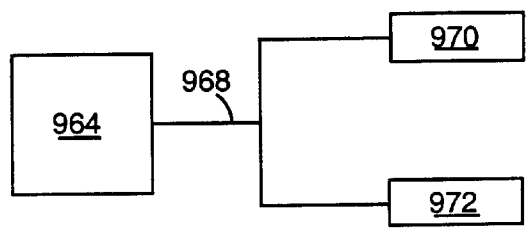
FIG. 13 illustrates a block diagram of a susceptor level detection assembly in accordance with one embodiment of the present invention.

FIG. 13 illustrates another embodiment of the present invention wherein camera 964 has an output 968 that is electrically coupled to a susceptor level indicator 970 and to a susceptor level controller 972 that is used to automatically adjust the levelness of the susceptor. In this manner, when the level of susceptor is determined to exceed a certain threshold, output signal 968 may be used to initiate logic within controller 972 to adjust the level of the susceptor.

Figure 14:
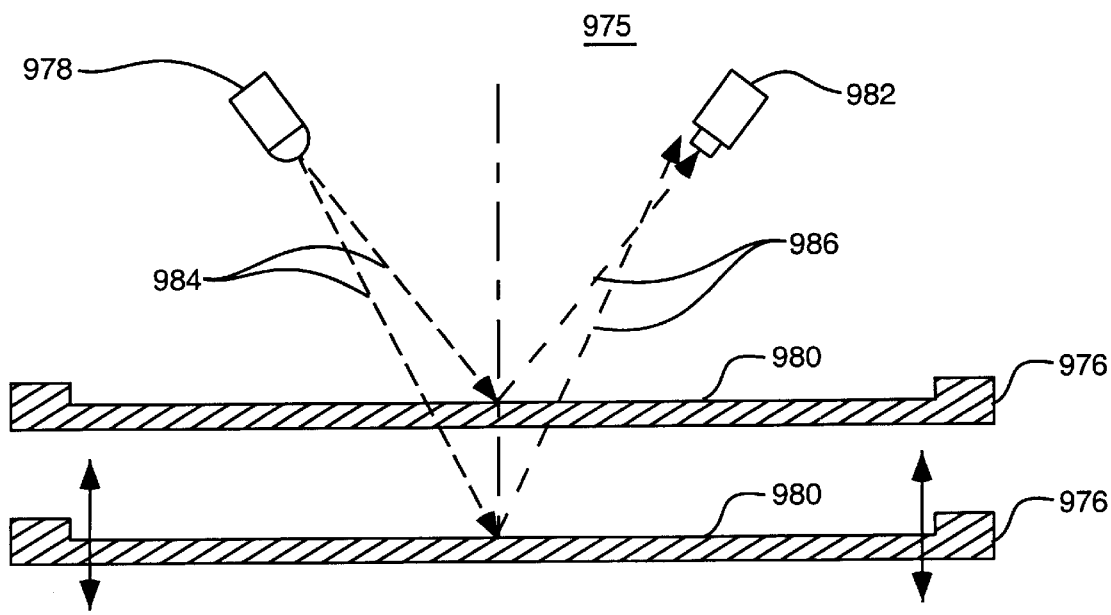
FIG. 14 illustrates a monitoring system of the present invention being used to detect the vertical movement of a susceptor during a lift cycle.

FIG. 14 shows a detection system 975 of the present invention being used to monitor the vertical displacement of a suscepter 976 during a susceptor lift cycle. Light transmitter 978 directs a light beam onto a surface 980 of susceptor 976. A camera 982 is positioned to observe the target produces on surface 980. As illustrated in FIG. 14, as the susceptor is displaced in a vertical direction, the angular orientation of the light beam 984 directed onto surface 980 changes. Likewise, the angular orientation of the reflected light beam 986 changes. As a result, the position and shape of the target changes as observed by camera 982. A logic circuit (not shown) located within or outside camera 982, is then used to produce measurement values indicative of the change in vertical displacement.

As previously noted, loading positioning pins (see FIG. 2) are typically used to raise a wafer above the surface of a susceptor while the wafer is being loaded or unloaded into a processing chamber. Detection system 975 is used to monitor the vertical displacement and inclination of the wafer as it is lowered and raised during the loading and unloading sequence. The ability to monitor and/or measure the displacement and inclination of the wafer as it is supported by the positioning pins permits the positioning pins to be adjusted when the inclination of the wafer exceeds a predetermined value. The ability to make adjustments reduces the likelihood of a wafer slipping off the positioning pins during the loading and unloading of the wafer onto and off the processing chamber.

A key advantage of the detection system of the present invention is that the levelness of the susceptor and the position of a wafer within a processing chamber may be monitored during the processing sequence. The ability to individually detect the level of the susceptor and the position of each wafer as it is being processed permits readjustments to be made during the processing sequence.

The present invention may also be used to provide in-situ film thickness information during the deposition process. An apparatus similar to that shown in FIG. 14 may be used to monitor the thickness of a film being deposited onto the surface of a wafer substrate. In such an embodiment, a CCD camera, a positional analog sensor, similar to those previously described, may be used to detect light being reflected from the surface of the wafer. The analog sensor provides an analog output voltage. By discetizing the analog output voltage, a discrete signal may be provided as an input to a digital system, such as a computer, digital read-out, controller, etc. The ability to monitor the film thickness during the deposition process permits a greater degree of control during the deposition process. For example, the rate at which a film is deposited may be controlled as a function of the deposited film thickness. The flow rate of a reactant gas can be increased or decreased in accordance with a control scheme that is at least partially dependent on deposited film thickness.

It is important to note that the present invention is not limited to any specific type of processing chamber or wafer handling system, nor is it limited to one type of susceptor design. Moreover, it is appreciated that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. An apparatus for monitoring the inclination of a wafer residing within a pocket of a susceptor in a semiconductor film deposition processing chamber, said apparatus comprising:
    a light transmitter positioned to direct a light beam onto the top surface of said wafer, said light beam forming a target on said wafer surface during film deposition processing;
    a detector for observing said target; and
    a logic circuit coupled to said detector for correlating the shape or position of said target to the inclination of said wafer.

2. The apparatus of claim 1 wherein said logic circuit produces a signal indicative of the inclination of said wafer, said signal being provided to a wafer position indicator means.

3. The apparatus of claim 1 wherein said light transmitter is a laser transmitter and said light beam is a laser beam.

4. The apparatus of claim 3 wherein said laser beam has a wavelength of less than 680 nanometers.

5. The apparatus of claim 2 wherein said wafer position indicator means comprises a visual display.

6. The apparatus of claim 2 wherein said wafer position indicator means comprises an audible alarm.

7. The apparatus of claim 1 wherein said detector comprises a CCD.

8. The apparatus of claim 1 wherein said detector comprises a still photography camera.

9. The apparatus of claim 1 wherein said detector comprises an analog position sensor.

10. An apparatus for monitoring the film thickness on a substrate during film deposition processing, the apparatus comprising:
    a light transmitter positioned to direct a light beam onto the top surface of said substrate, said light beam forming a target on said substrate surface during film deposition processing;
    a detector for observing said target; and
    a logic circuit coupled to said detector for correlating the shape or position of said target to the thickness of said film on said substrate.

11. The apparatus of claim 10 wherein said light transmitter is a laser transmitter and said light beam is a laser beam.

12. The apparatus of claim 11 wherein said detector comprises an analog position sensor.

13. The apparatus of claim 11 wherein said detector comprises a charged couple diode (CCD).

14. An apparatus for monitoring the levelness of a susceptor in a semiconductor film deposition processing chamber, the apparatus comprising:
    a light transmitter positioned to direct a light beam onto a surface of said susceptor, said light beam forming a target on said surface during film deposition processing;
    a detector for observing said target; and
    a logic circuit coupled to said detector for correlating the shape or position of said target to the levelness of said susceptor.

15. The apparatus of claim 14 wherein said logic circuit produces a signal indicative of the levelness of said susceptor, said signal being provided to a susceptor level indicator means.

16. The apparatus of claim 14 wherein said detector comprises a CCD.

17. The apparatus of claim 14 wherein said detector comprises a still photography camera.

18. The apparatus of claim 14 wherein said detector comprises an analog position sensor.

19. An apparatus for monitoring the vertical position of a susceptor in a semiconductor film deposition processing chamber, the apparatus comprising:
    a light source positioned to direct a light beam onto a surface of said susceptor, said light beam forming a target on said surface during film deposition processing;
    a detector for observing said target; and
    a logic circuit coupled to said detector for correlating the shape or position of said target to the vertical position of said susceptor.

20. The apparatus of claim 19 wherein said logic circuit produces a signal indicative of the vertical position of said susceptor, said signal being provided to a susceptor position indicator means.

21. The apparatus of claim 19 wherein said light source is a laser transmitter and said light beam is a laser beam.

22. The apparatus of claim 19 wherein said detector comprises a CCD.

23. The apparatus of claim 19 wherein said detector comprises a still photography camera.

24. The apparatus of claim 19 wherein said detector comprises an analog position sensor.

25. A semiconductor wafer processing assembly comprising:
    a processing chamber having a susceptor, said susceptor having a pocket for holding a wafer;
    a heat source for providing heat to the processing chamber;
    an automated wafer handling system for positioning said wafer into said pocket of said susceptor, said wafer handling system being controlled by a controller;
    a light transmitter positioned to direct a light beam onto the top surface of said wafer to produce a target;
    a camera for observing said target; and
    wafer position indicating means coupled to said camera.

26. The assembly of claim 25 further comprising a logic circuit coupled to said camera, said logic circuit correlating the shape of said target to the inclination of said wafer and producing an output signal indicative of the inclination of said wafer.

27. The assembly of claim 26 wherein said output signal is an input to said wafer handling system controller.

28. The assembly of claim 25 further comprising a logic circuit coupled to said camera, said logic circuit correlating the position of said target to the inclination of said wafer and producing an output signal indicative of the inclination of said wafer.

29. The assembly of claim 28 wherein said output signal is an input to said wafer handling system controller.

30. The assembly of claim 25 wherein said light transmitter and said camera are located outside said processing chamber.

31. An apparatus for monitoring the inclination of a wafer residing within a pocket of a semiconductor processing chamber susceptor, said apparatus comprising:
- a heat source for providing heat to the processing chamber;
- a light transmitter positioned to direct a light beam onto the top surface of said wafer, said light beam forming a target on said wafer surface, wherein said light transmitter is a laser transmitter and said light beam is a laser beam, wherein said laser beam has a wavelength of less than 680 nanometers;
- a detector for observing said target; and
- a logic circuit coupled to said detector for correlating the shape or position of said target to the inclination of said wafer.

32. The apparatus of claim 31 wherein said logic circuit produces a signal indicative of the inclination of said wafer, said signal being provided to a wafer position indicator.

33. The apparatus of claim 31 wherein said logic circuit produces a signal indicative of the inclination of said wafer, said signal being provided to a wafer handling system controller.

34. An apparatus for monitoring the inclination of a wafer residing within a pocket of a semiconductor processing chamber susceptor, said apparatus comprising:
- a heat source for providing heat to the processing chamber;
- a light transmitter positioned to direct a light beam onto the top surface of said wafer, said light beam forming a target on said wafer surface;
- a detector for observing said target; and
- a logic circuit coupled to said detector for correlating the shape or position of said target to the inclination of said wafer, wherein said logic circuit produces a signal indicative of the inclination of said wafer, said signal being provided to a wafer position indicator means, wherein said wafer position indicator means comprises a visual display.

35. The apparatus of claim 34 wherein said light transmitter is a laser transmitter and said light beam is a laser beam.

36. The apparatus of claim 35 wherein said laser beam has a wavelength of less than 680 nanometers.

37. An apparatus for monitoring the inclination of a wafer residing within a pocket of a semiconductor processing chamber susceptor, said apparatus comprising:
- a heat source for providing heat to the processing chamber;
- a light transmitter positioned to direct a light beam onto the top surface of said wafer, said light beam forming a target on said wafer surface;
- a detector for observing said target, wherein said detector comprises a charged couple diode (CCD); and
- a logic circuit coupled to said detector for correlating the shape or position of said target to the inclination of said wafer.

38. The apparatus of claim 37 wherein said logic circuit produces a signal indicative of the inclination of said wafer, said signal being provided to a wafer position indicator.

39. The apparatus of claim 37 wherein said logic circuit produces a signal indicative of the inclination of said wafer, said signal being provided to a wafer handling system controller.

40. The apparatus of claim 37 wherein said light transmitter is a laser transmitter and said light beam is a laser beam.

41. The apparatus of claim 40 wherein said laser beam has a wavelength of less than 680 nanometers.

42. An apparatus for monitoring the inclination of a wafer residing within a pocket of a semiconductor processing chamber susceptor, said apparatus comprising:
- a heat source for providing heat to the processing chamber;
- a light transmitter positioned to direct a light beam onto the top surface of said wafer, said light beam forming a target on said wafer surface;
- a detector for observing said target, wherein said detector comprises an analog position sensor; and
- a logic circuit coupled to said detector for correlating the shape or position of said target to the inclination of said wafer.

43. The apparatus of claim 42 wherein said logic circuit produces a signal indicative of the inclination of said wafer.

44. The apparatus of claim 43 wherein said signal is provided to a wafer position indicator.

45. The apparatus of claim 43 wherein said signal is provided to a wafer handling system controller.

46. The apparatus of claim 42 wherein said light transmitter is a laser transmitter and said light beam is a laser beam.

47. The apparatus of claim 46 wherein said laser beam has a wavelength of less than 680 nanometers.

48. An apparatus for monitoring the film thickness on a substrate comprising:
- a processing chamber including a heat source for providing heat to the processing chamber;
- a light transmitter positioned to direct a light beam onto the top surface of said substrate, said light beam forming a target on said substrate surface, wherein said light transmitter is a laser transmitter and said light beam is a laser beam;
- a detector for observing said target; and
- a logic circuit coupled to said detector for correlating the shape or position of said target to the thickness of said film on said substrate.

49. The apparatus of claim 48 wherein said logic circuit produces a signal indicative of the inclination of said wafer, said signal being provided to a wafer position indicator.

50. The apparatus of claim 48 wherein said logic circuit produces a signal indicative of the inclination of said wafer, said signal being provided to a wafer handling system controller.

51. An apparatus for monitoring the film thickness on a substrate comprising:
- a processing chamber including a heat source for providing heat to the processing chamber;
- a light transmitter positioned to direct a light beam onto the top surface of said substrate, said light beam forming a target on said substrate surface, wherein said light transmitter is a laser transmitter and said light beam is a laser beam;

a detector for observing said target, wherein said detector comprises an analog position sensor; and a logic circuit coupled to said detector for correlating the shape or position of said target to the thickness of said film on said substrate.

52. The apparatus of claim 51 wherein said logic circuit produces a signal indicative of the inclination of said wafer, said signal being provided to a wafer position indicator.

53. The apparatus of claim 51 wherein said logic circuit produces a signal indicative of the inclination of said wafer, said signal being provided to a wafer handling system controller.

54. An apparatus for monitoring the film thickness on a substrate comprising:

a processing chamber including a heat source for providing heat to the processing chamber;

a light transmitter positioned to direct a light beam onto the top surface of said substrate, said light beam forming a target on said substrate surface, wherein said light transmitter is a laser transmitter and said light beam is a laser beam;

a detector for observing said target, wherein said detector comprises a charged couple diode (CCD); and a logic circuit coupled to said detector for correlating the shape or position of said target to the thickness of said film on said substrate.

55. The apparatus of claim 54 wherein said logic circuit produces a signal indicative of the inclination of said wafer, said signal being provided to a wafer position indicator.

56. The apparatus of claim 54 wherein said logic circuit produces a signal indicative of the inclination of said wafer, said signal being provided to a wafer handling system controller.

57. An apparatus for monitoring the levelness of a semiconductor processing chamber susceptor comprising:

a heat source for providing heat to the processing chamber;

a light transmitter positioned to direct a light beam onto a surface of said susceptor, said light beam forming a target on said surface;

a detector for observing said target; and a logic circuit coupled to said detector for correlating the shape or position of said target to the levelness of said susceptor, wherein said logic circuit produces a signal indicative of the levelness of said susceptor, said signal being provided to a susceptor level indicator.

58. The apparatus of claim 57 wherein said signal is provided to a susceptor level controller.

59. The apparatus of claim 57 wherein said light transmitter is a laser transmitter and said light beam is a laser beam.

60. The apparatus of claim 59 wherein said laser beam has a wavelength of less than 680 nanometers.

61. An apparatus for monitoring the levelness of a semiconductor processing chamber susceptor comprising:

a heat source for providing heat to the processing chamber;

a light transmitter positioned to direct a light beam onto a surface of said susceptor, said light beam forming a target on said surface;

a detector for observing said target, wherein said detector comprises a CCD;

a logic circuit coupled to said detector for correlating the shape or position of said target to the levelness of said susceptor.

62. The apparatus of claim 61 wherein said light transmitter is a laser transmitter and said light beam is a laser beam.

63. The apparatus of claim 62 wherein said laser beam has a wavelength of less than 680 nanometers.

64. The apparatus of claim 62 wherein said logic circuit produces a signal indicative of the levelness of said susceptor, said signal being provided to a susceptor level indicator.

65. The apparatus of claim 62 wherein said logic circuit produces a signal indicative of the levelness of said susceptor, said signal being provided to a susceptor level controller.

66. An apparatus for monitoring the levelness of a semiconductor processing chamber susceptor comprising:

a heat source for providing heat to the processing chamber;

a light transmitter positioned to direct a light beam onto a surface of said susceptor, said light beam forming a target on said surface;

a detector for observing said target, wherein said detector comprises an analog position sensor; and a logic circuit coupled to said detector for correlating the shape or position of said target to the levelness of said susceptor.

67. The apparatus of claim 66 wherein said light transmitter is a laser transmitter and said light beam is a laser beam.

68. The apparatus of claim 67 wherein said laser beam has a wavelength of less than 680 nanometers.

69. The apparatus of claim 66 wherein said logic circuit produces a signal indicative of the levelness of said susceptor, said signal being provided to a susceptor level indicator.

70. The apparatus of claim 66 wherein said logic circuit produces a signal indicative of the levelness of said susceptor, said signal being provided to a susceptor level controller.

71. An apparatus for monitoring the vertical position of a semiconductor processing chamber susceptor comprising:

a heat source for providing heat to the processing chamber;

a light source positioned to direct a light beam onto a surface of said susceptor, said light beam forming a target on said surface;

a detector for observing said target; and a logic circuit coupled to said detector for correlating the shape or position of said target to the vertical position of said susceptor, wherein said logic circuit produces a signal indicative of the vertical position of said susceptor, said signal being provided to a susceptor position indicator.

72. The apparatus of claim 71 wherein said light transmitter is a laser transmitter and said light beam is a laser beam.

73. The apparatus of claim 72 wherein said laser beam has a wavelength of less than 680 nanometers.

74. The apparatus of claim 71 wherein said signal is provided to a susceptor position controller.

75. An apparatus for monitoring the vertical position of a semiconductor processing chamber susceptor comprising:

a heat source for providing heat to the processing chamber;

a light source positioned to direct a light beam onto a surface of said susceptor, said light beam forming a target on said surface, wherein said light source is a laser transmitter and said light beam is a laser beam;

a detector for observing said target; and a logic circuit coupled to said detector for correlating the shape or position of said target to the vertical position of said susceptor.

76. The apparatus of claim 75 wherein said laser beam has a wavelength of less than 680 nanometers.

77. The apparatus of claim 75 wherein said logic circuit produces a signal indicative of the vertical position of said susceptor, said signal being provided to a susceptor position indicator means.

78. The apparatus of claim 75 wherein said logic circuit produces a signal indicative of the vertical position of said susceptor, said signal being provided to a susceptor position controller means.

79. An apparatus for monitoring the vertical position of a semiconductor processing chamber susceptor comprising:

a heat source for providing heat to the processing chamber;

a light source positioned to direct a light beam onto a surface of said susceptor, said light beam forming a target on said surface;

a detector for observing said target, wherein said detector comprises a charged couple diode (CCD); and a logic circuit coupled to said detector for correlating the shape or position of said target to the vertical position of said susceptor.

80. The apparatus of claim 79 wherein said logic circuit produces a signal indicative of the vertical position of said susceptor, said signal being provided to a susceptor position indicator means.

81. The apparatus of claim 79 wherein said logic circuit produces a signal indicative of the vertical position of said susceptor, said signal being provided to a susceptor position controller means.

82. The apparatus of claim 79 wherein said light transmitter is a laser transmitter and said light beam is a laser beam.

83. The apparatus of claim 82 wherein said laser beam has a wavelength of less than 680 nanometers.

84. An apparatus for monitoring the vertical position of a semiconductor processing chamber susceptor comprising:

a heat source for providing heat to the processing chamber;

a light source positioned to direct a light beam onto a surface of said susceptor, said light beam forming a target on said surface;

a detector for observing said target, wherein said detector comprises a still photography camera; and a logic circuit coupled to said detector for correlating the shape or position of said target to the vertical position of said susceptor.

85. The apparatus of claim 84 wherein said logic circuit produces a signal indicative of the vertical position of said susceptor, said signal being provided to a susceptor position indicator means.

86. The apparatus of claim 84 wherein said logic circuit produces a signal indicative of the vertical position of said susceptor, said signal being provided to a susceptor position controller means.

87. The apparatus of claim 84 wherein said light transmitter is a laser transmitter and said light beam is a laser beam.

88. The apparatus of claim 87 wherein said laser beam has a wavelength of less than 680 nanometers.

89. An apparatus for monitoring the vertical position of a semiconductor processing chamber susceptor comprising:

a heat source for providing heat to the processing chamber;

a light source positioned to direct a light beam onto a surface of said susceptor, said light beam forming a target on said surface;

a detector for observing said target, wherein said detector comprises an analog position sensor; and a logic circuit coupled to said detector for correlating the shape or position of said target to the vertical position of said susceptor.

90. The apparatus of claim 89 wherein said logic circuit produces a signal indicative of the vertical position of said susceptor, said signal being provided to a susceptor position indicator means.

91. The apparatus of claim 89 wherein said logic circuit produces a signal indicative of the vertical position of said susceptor, said signal being provided to a susceptor position controller means.

92. The apparatus of claim 89 wherein said light transmitter is a laser transmitter and said light beam is a laser beam.

93. The apparatus of claim 92 wherein said laser beam has a wavelength of less than 680 nanometers.

* * * * *